United States Patent [19]

Arai et al.

[11] Patent Number: 4,897,281

[45] Date of Patent: Jan. 30, 1990

[54] PROCESS FOR THE FORMATION OF A FUNCTIONAL DEPOSITED FILM BY WAY OF MICROWAVE PLASMA CVD METHOD

[75] Inventors: Takayoshi Arai; Shigehira Iida, both of Ueno; Keishi Saitoh, Nabari; Junichiro Hashizume, Ueno; Tetsuya Takei, Nagahama, all of Japan

[73] Assignee: Canon Kabushiki Kaisha, Tokyo, Japan

[21] Appl. No.: 198,746

[22] Filed: May 25, 1988

[30] Foreign Application Priority Data

May 26, 1987 [JP] Japan .................................. 62-126885

[51] Int. Cl.⁴ .............................................. B05D 3/06
[52] U.S. Cl. ........................................... 427/8; 427/39; 427/45.1; 427/346
[58] Field of Search ....................... 427/8, 38, 39, 45.1, 427/346

[56] References Cited

U.S. PATENT DOCUMENTS

| | | | |
|---|---|---|---|
| 4,619,729 | 10/1986 | Johncock et al. | 156/606 |
| 4,637,938 | 1/1987 | Lee et al. | 427/53.1 |
| 4,667,076 | 5/1987 | Amada | 427/45.1 |

Primary Examiner—Bernard D. Pianalto
Attorney, Agent, or Firm—Fitzpatrick, Cella, Harper & Scinto

[57] ABSTRACT

According to the present invention, there is provided an improved process for the formation of a deposited film by way of a microwave plasma CVD method, the improvement comprising monitoring an effective power of a microwave to be introduced into a reaction chamber, leading to a control means an output signal indicative of the effective power corresponding a plasma intensity, and automatically controlling the matching between the reaction chamber and the microwave to be introduced into the reaction chamber according to an output signal from the control means. According to the above process, even after a long discharge time has elapsed, the plasma intensity in the reaction chamber may be maintained constant, and the effective power of the microwave to be introduced into the reaction chamber may be therefore maintained constant. Because of this, it becomes possible to repeatedly and stably prepare a desired deposited film excelling in the uniformity of the thickness and that of the quality at a high deposition rate.

8 Claims, 13 Drawing Sheets

PROCESS FOR THE FORMATION OF A FUNCTIONAL DEPOSITED FILM BY WAY OF MICROWAVE PLASMA CVD METHOD

FIELD OF THE INVENTION

The present invention relates to a process for the formation of a deposited film, especially, a functional deposited film on a substrate by way of a microwave plasma CVD method, and more particularly to a process for the formation of an amorphous semiconductor film for use in a semiconductor device, electrophotographic photosensitive member, image input line sensor, image pickup device, photovoltaic device, etc. by way of a microwave plasma CVD method.

BACKGROUND OF THE INVENTION

There have been conventionally proposed a number of amorphous semiconductor films such as amorphous silicon film which is, for example, composed of amorphous silicon compensated by hydrogen (H) and/or halogen (X) (fluorine, chlorine, etc.) [which will be hereinafter referred to as "A-Si(H,X)"] for use as element members for a semiconductor device, electrophotographic photosensitive member, image input line sensor, image pickup device, photovoltaic device, other various electronic elements and optical elements. Some of these amorphous semiconductor films have been practically used.

It is known that such deposited films may be formed by a plasma CVD method, that is by the glow discharge in a reaction gas using direct current, high-frequency or microwave to thereby form a thin deposited film on a substrate of glass, quartz, heat resistant synthetic resin, stainless steel, aluminum, etc. Along with this, various apparatuses for carrying out such process have been proposed.

In particular, a plasma CVD method using microwave glow discharge decomposition, namely, a microwave plasma CVD method (which will be hereinafter referred to as "MW-PCVD method") has been recently noticed on the industrial scale.

In the case that a reaction gas is decomposed using a high-frequency energy to form a deposited film, for instance, for an electrophotographic photosensitive member, the formation of such deposited film by way of the conventional plasma CVD method is carried out as follows:

There is shown a representative apparatus for forming the deposited film in FIG. 6. Referring to FIG. 6, the apparatus includes a high-frequency power source 601, a matching box 602, a diffusion pump and/or mechanical booster pump 603, a motor 604 for rotating an Al substrate 605, a heater 606 for heating the Al substrate 605, a gas feed pipe 607, a high-frequency induction cathode 608, a shield member 609, an electric power source 610 for the heater, valves 621–625 and 641–645, mass flow controllers 631–635, regulators 651–655, reservoir 661 for $H_2$ gas reservoir 663 for silane ($SiH_4$), reservoir 664 for NO, and reservoir 665 for methane ($CH_4$).

A process for the formation of the deposited film by using the apparatus shown in FIG. 6 is carried out in the following manner. First, main cocks of all the reservoirs 661–665 are closed, and all of the mass flow controllers and the valves are opened. Then, the diffusion pump 603 is operated to evacuate the inside of the deposition chamber to $10^{-7}$ Torr. At the same time, the heater 601 is actuated to heat the Al substrate 605 to about 250° C., and it is maintained at this temperature. Then, the valves 621–625, 641–645 and 651–655 are all closed, and the main cocks of the cylinders 661–665 are all opened. Then, the diffusion pump 603 is replaced by a mechanical booster pump. A secondary pressure of the valves 651–655 with regulators is set to 1.5 kg/cm². The mass flow controller 631 is set at a predetermined value. Then, the valve 641 is opened, and subsequently the valve 621 is opened to introduce the $H_2$ gas into the deposition chamber. Then, in the same manner, the reaction gas as required, e.g., the $SiH_4$ gas is introduced into the deposition chamber.

When the inner pressure of the deposition chamber becomes stable, the high-frequency power source 601 is switched on to generate a high frequency of 13.56 MHz, thereby generating glow discharge between the Al substrate 605 and the cathode 608. Thus, the deposited film is formed on the Al substrate 605.

In the formation of the deposited film by using the apparatus shown in FIG. 6, an effective power of the high frequency in the deposition chamber is controlled by reading an incident power and a reflected power indicated by a wattmeter (not shown) attached to the high-frequency power source 601 and obtaining a difference between the incident power and the reflected power.

In FIG. 7(A), there is shown a representative MW-PCVD apparatus for forming a deposited film, for instance, for electrophotographic photosensitive member.

FIGS. 7(B) and 7(C) are a vertical sectional view and a horizontal sectional view of the apparatus shown in FIG. 7(A), respectively.

Referring to FIGS. 7(A) to 7(C), the apparatus includes a reaction chamber 701, a microwave transmissive window 702 made of alumina ceramics or quartz, a waveguide 703, an exhaust pipe 704, a heater 707' installed in a substrate holder 707 for heating a substrate 705 and maintaining the substrate at a predetermined temperature, and a reaction gas supply tube 708. The reaction gas supply tube 708 is provided with a plurality of gas liberation nozzle 708' being directed to discharge space 706.

The reaction chamber 701 is so designed as to start discharge by self-exciting discharge without using a discharge trigger or the like, and it has a cavity resonator structure capable of resonating with an oscillation frequency of a microwave power source.

The formation of a deposited film by using the apparatus shown in FIGS. 7(A) to 7(C) is carried out as follows:

The inside of the reaction chamber 701 is evacuated through the exhaust pipe 704, and the heater 707' is actuated to heat the substrate 705 to a predetermined temperature and it is maintained at this temperature. Then, the substrate 705 is rotated by a drive motor (not shown) at a desired constant speed. Then, in the case of forming an amorphous silicon deposited film, raw material gases such as silane gas and hydrogen gas are fed through the gas supply tube 708, and the gas liberation nozzles 708' into the reaction chamber 701. At the same time, a microwave having a frequency of 500 MHz or more, preferably, 2.45 GHz is caused from the microwave power source 711. The microwave is supplied through the waveguide 703 and the microwave transmissive window 702 into the reaction chamber 701. Thus, the raw material gases thus introduced into the reaction chamber 701 is excited and decomposed with the action the microwave energy to cause neutral radicals, ions, electrons, etc. Then, these are reacted with each other to form a deposited film on the substrate 705.

In the process for the formation of the deposited film by decomposing the raw material gases as mentioned above, an effective power of the microwave to be introduced into the reaction chamber 701 is controlled by reading an incident power and a reflected power indicated by a wattmeter (designated by reference numeral 710 in FIG. 7(B)) provided on the way of the waveguide 703 and obtaining a difference between the incident power and the reflected power as an actual power. Then, the actual power is adjusted by a stab tuner 709 so as to minimize the reflected power. However, as the adjustment of the actual power is manually carried out, it is difficult to do it as expected.

Further, as the microwave has a high oscillation frequency, that is, it has a short wavelength in contrast to the high-frequency wave as mentioned previously, the microwave is reflected on the microwave transmissive window 702, the substrate 705, the gas supply pipe 708, etc. Thus, many reflective surfaces are present to cause multiple reflection. Accordingly, the accurate control of the effective power of the microwave according to the difference between the incident power and the reflected power is rendered more difficult than the case of formation of the deposited film by the high frequency.

Furthermore, as the discharge proceeds, there will occur a difference in quantity of permeation of the microwave due to heating of the microwave transmissive window 702, A-Si(H,X) film will deposit also on the window 702, the gas supply pipe 708. As a result, the resonance condition between the microwave permeated through the microwave transmissive window 702 and the reaction chamber 701 is slipped to cause ununiform discharge in the reaction chamber 701 and also to cause a reduction in the actual effective power to be introduced into the reaction chamber 701 through an apparent effective power by the difference between the incident power and the reflected power indicated by the wattmeter 710 is identical. And, should the formation of the film be carried out under the above condition, it is difficult to obtain a desired deposited film usable for an electrophotographic photosensitive member, since the resulting deposited film unavoidably becomes ununiform in thickness and film quality.

As a result, the resulting electrophotographic photosensitive member cannot provide satisfactory functions as required. In the case of mass production, a yield is rendered greatly low.

Thus, in the formation of the deposited film by way of the MW-PCVD method, the control of the effective power of the microwave to be introduced into the reaction chamber upon the difference between the incident power and the reflected power is more problematic than in the case of the formation of the deposited film by high frequency. In view of the above, there is an increased demand to provide a proper method for controlling the effective power of the microwave.

SUMMARY OF THE INVENTION

It is a primary object of the present invention to solve the above problems in the conventional process for the formation of a deposited film and provide a process for the stable high-speed formation of a deposited film by way of the MW-PCVD method, employable for an element member in a semiconductor device, electrophotographic photosensitive member, image input line sensor, image pickup device, photovoltaic device, other various electronic elements and optical elements, etc.

It is another object of the present invention to provide a process for the formation of a deposited film which is improved in mass production and may provide a deposited film having a high quality and superior electrical and optical characteristics.

It is a further object of the present invention to provide a process for the formation of A-Si(H,X) film by way of the MW-PCVD method, wherein means for monitoring an effective power of a microwave is provided in a reaction chamber, and an output signal from the monitoring means indicative of the effective power is led to a control means, and matching between the reaction chamber and the microwave to be introduced into the chamber is automatically controlled according to an output signal from the control means.

According to the present invention, there is provided an improvement in the process for the formation of a deposited film by way of a microwave phasma CVD method, the improvement comprises monitoring an effective power of a microwave to be introduced into a reaction chamber, leading to a control means an output signal indicative of the effective power corresponding to a plasma intensity, and automatically controlling the matching between the reaction chamber and the microwave to be introduced into the reaction chamber according to the output signal from the control means. According to the improved process of the present invention, even upon continuous discharge for a long period of time, the plasma intensity in the reaction chamber may be maintained constant, and the effective power of the microwave to be introduced into the reaction chamber may be therefore maintained constant. Because of this, it becomes possible to repeatedly and stably form a desired deposited film which is uniform in both the thickness and the quality at a high deposition rate. The resulting deposited film has superior electrical and optical characteristics. Further, the process according to the present invention is suited to mass production of such desired deposited films.

DETAILED DESCRIPTION OF THE PREFERRED EMBODIMENTS

The present invention provides a process for the formation of a deposited film by way of the MW-PCVD method capable of achieving the foregoing objects. The process of the present invention generally comprises the steps of supplying a reaction gas into a substantially enclosed reaction chamber capable of accommodating a plurality of substrates, introducing a microwave energy into the reaction chamber, forming a glow discharge plasma in the reaction chamber, and depositing a thin film onto the substrate. The improvement in the process comprises monitoring an effective power of a microwave to be introduced into the reaction chamber, leading to a control means an output signal indicative of the effective power corresponding to a plasma intensity, and automatically controlling the matching between the reaction chamber and the microwave to be introduced into the reaction chamber according to the output signal from the control means.

There will now be described some preferred embodiments of the MW-PCVD method according to the present invention. However, the present invention is not limited to these embodiments.

Figure 1A:
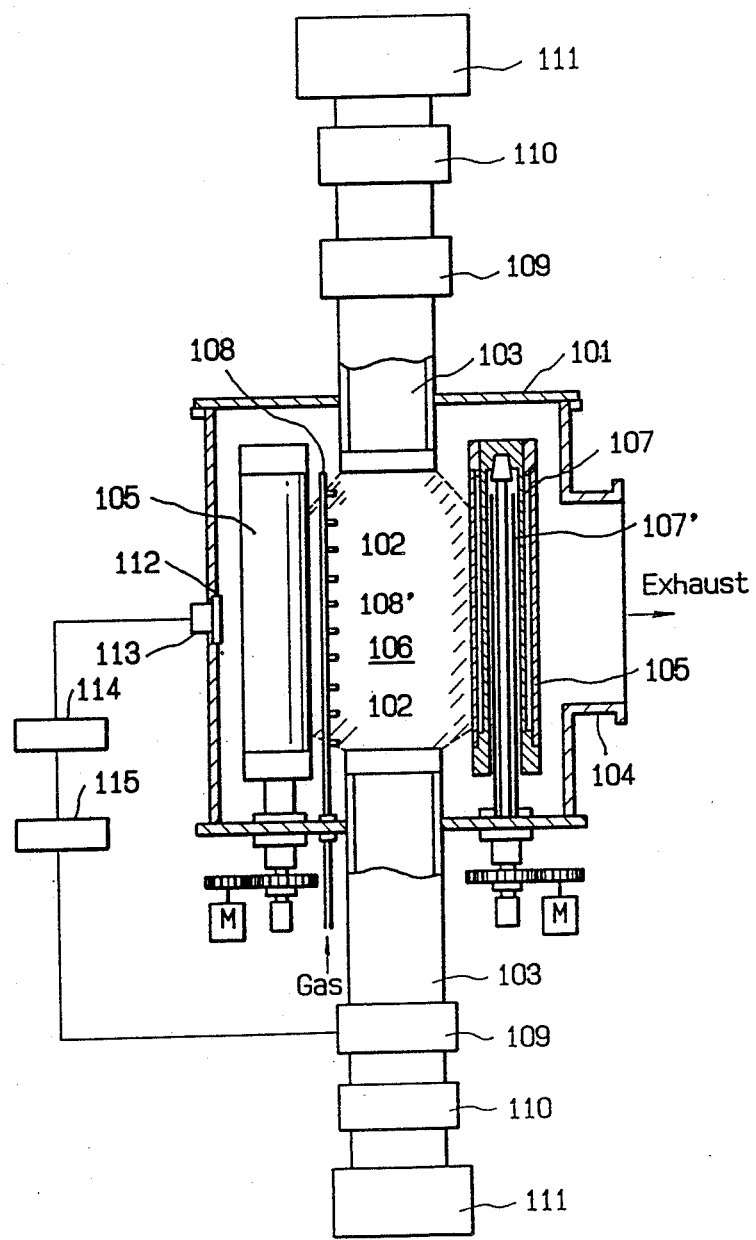
FIG. 1(A) is a schematic vertical sectional view of a preferred embodiment of the fabrication apparatus suitable for producing an electrophotographic photosensitive member by the MW-PCVD method of the present invention.

Referring to FIG. 1(A) which is a vertical sectional view of a first preferred embodiment of the apparatus suitable for the production of an electrophotographic photosensitive member by way of the MW-PCVD method according to the present invention. The apparatus includes a reaction chamber 101, a microwave transmissive window 102 made of a dielectric material (quartz glass, for example) which is capable of efficiently introducing a microwave therethrough into the reaction chamber 101 and maintaining gas tightness under vacuum, a waveguide 103 made of a conventional metal material which is connected through a stab tuner 109 serving as an automatic adjusting mechanism, a microwave wattmeter 110 and an isolator (not shown) to a microwave power source 111, an exhaust pipe 104 opened at its one end into the reaction chamber 101 and connected at the other end to an exhaust device (not shown), a substrate 105 placed on a substrate holder 107 having an electric heater 107′ for heating the substrate 105 to a temperature suitable for depositing a desired film thereon, and a reaction gas supply pipe 108 connected to gas reservoir (not shown). The supply pipe 108 is made of a dielectric material capable of efficiently transmitting a microwave. The gas supply pipe 108 is provided with a plurality of gas liberation nozzles 108′ for liberating the reaction gas toward a discharge space 106.

The apparatus further includes a detector (illuminometer) 113 for detecting an optical emission intensity of excited species and monitoring a plasma intensity in the discharge space 106, an intensity indicator 114, a control unit 115, and a monitor window 112 (made of a Pyrex glass, for example) for monitoring the plasma intensity with the detector 113. The plasma intensity monitored is automatically adjusted by the stab tuner 109, so that it may be maintained constant. That is, when a microwave power is applied from the microwave power source 111 through the microwave transmissive window 102 to the discharge space 106, the matching between the microwave power as applied and the reaction chamber 101 is automatically adjusted by the stab tuner 109 to create a plasma in the discharge space 106. The plasma intensity at this time is monitored by the detector 113 through the monitor window 112, and is indicated by the intensity indicator 114. Then, an output signal from the intensity indicator 114 is led to the control unit 115. If the plasma intensity is fluctuates, as the discharge time proceeds from the starting of the discharge, a control circuit (See FIG. 1(B)) of the control unit 115 is operated by the output signal indicative of the plasma intensity as monitored, and the stab tuner 109 is controlled so as to make the matching adjusted as desired. In this way, the plasma intensity is adjusted to that at the time of starting of the discharge.

Figure 5:
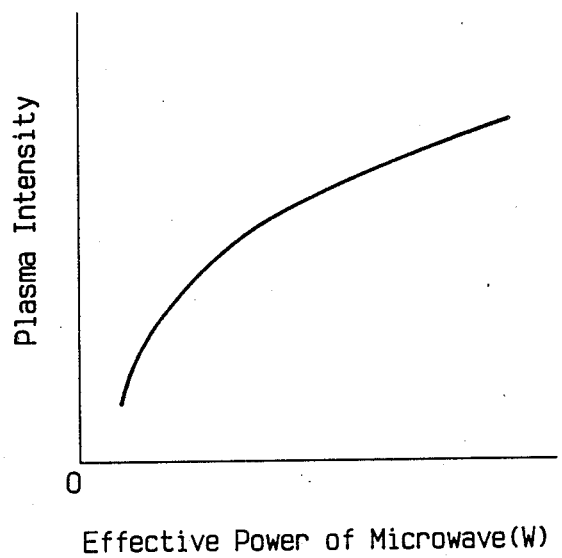
FIG. 5 is a graph showing the relation between an effective power of a microwave and a plasma intensity in the reaction chamber in the preferred embodiment shown in FIG. 1(A)
Figure 6:
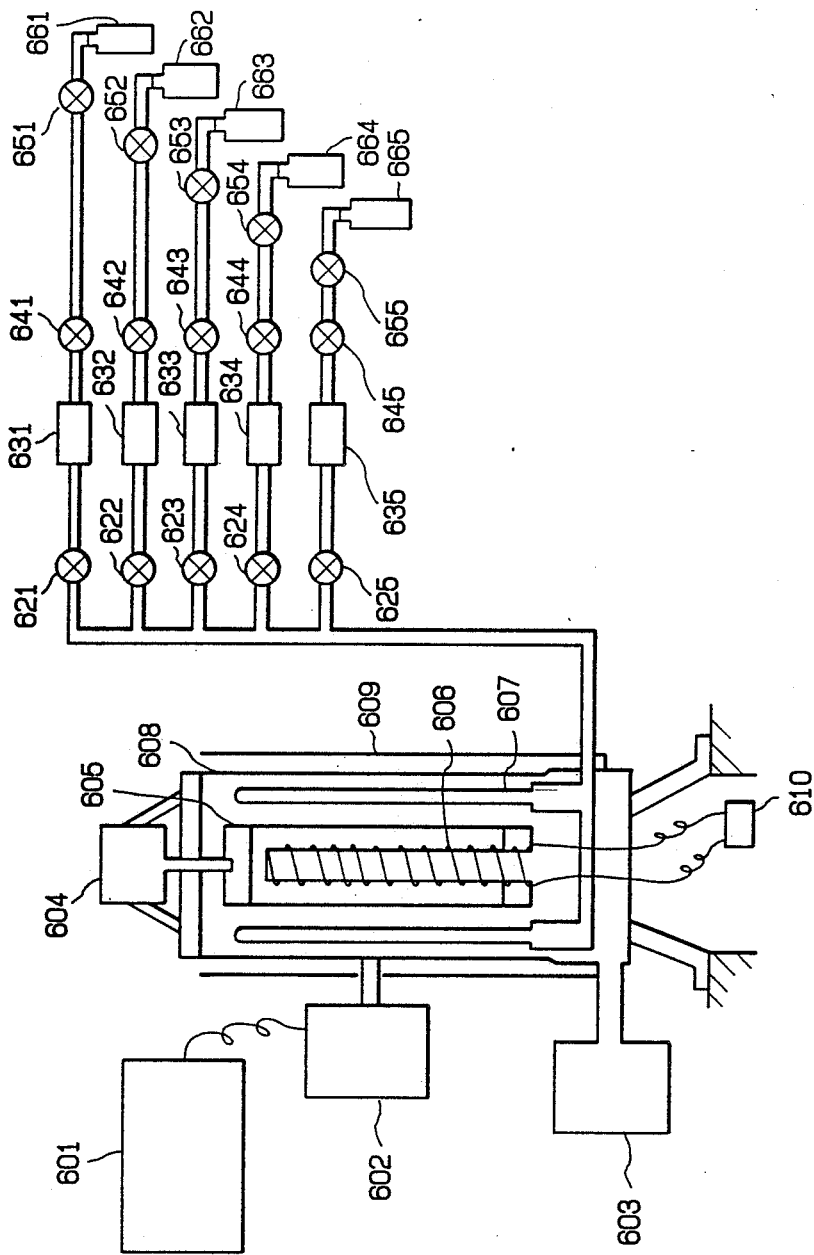
FIG. 6 is a schematic illustration of a typical example of the conventional deposited film forming apparatus using a high frequency.

As shown in FIG. 5, there is certain relation between the plasma intensity and the effective power of the microwave to be introduced into the reaction chamber 101, and the effective power is therefore rendered constant all the time.

Accordingly, the plasma in the discharge space 106 is maintained uniform irrespective of the time elapsed, and the film to be deposited onto the substrate 105 is made uniform in both the thickness and the quality.

Figure 1B:
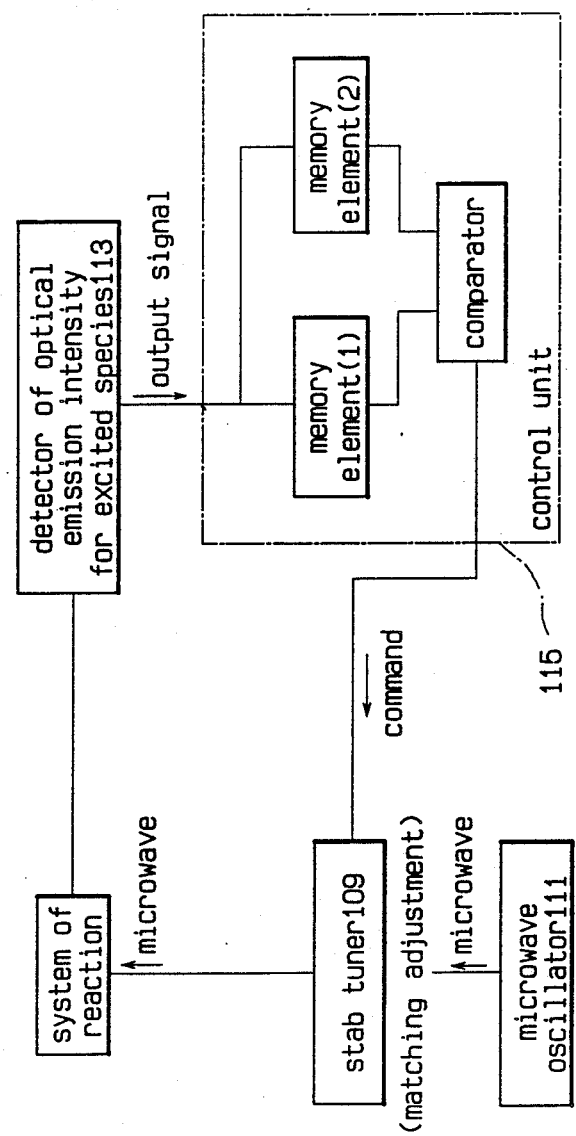
FIG. 1(B) is a block diagram of a control circuit in the apparatus shown in FIG. 1(A)

Referring to FIG. 1(B) which shows a circuit diagram of the apparatus shown in FIG. 1(A), an optical emission intensity of excited species at the time of starting of the discharge is detected by the detector 113, and an output signal from the detector 113 is stored by a memory element (1) in the control unit 115. Then, an optical emission intensity of excited species after a fixed time elapsed is periodically detected by the detector 113, and an output signal from the detector 113 is stored by another memory element (2). The value stored in the memory element (2) is compared with the value stored in the memory element (1) by a comparator. When the former is different from the latter, a command indicative of such a difference is generated from the control unit 115 to the stab tuner 109, so that the stab tuner 109 is automatically adjusted to make the matching adjusted, thereby maintaining the optical emission intensity constant.

Figure 2A:
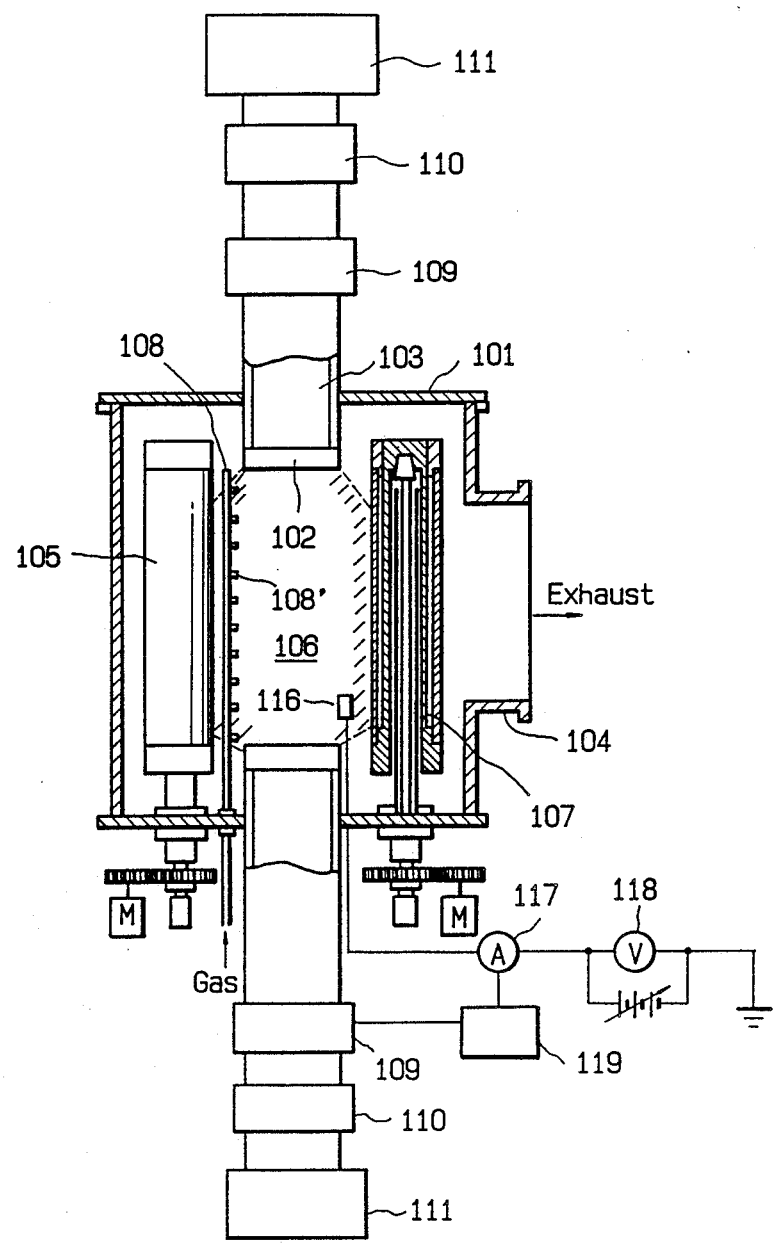
FIG. 2(A) is a schematic vertical sectional view of another preferred embodiment of the fabrication apparatus suitable for producing an electrophotographic photosensitive member by the MW-PCVD method of the present invention.

Referring next to FIG. 2(A) which shows a second preferred embodiment of the apparatus, a Langmuir probe is used as the means for monitoring the plasma intensity in the discharge space 106.

A small metal electrode 116 is inserted into the discharge space 106. Upon generation of the discharge, voltage is applied to the metal electrode 116. Then, a signal of current at the electrode corresponding to a plasma intensity is led to a control unit 119. If the current signal from the electrode 116 is changed from a value at the time of starting of the discharge with a change in the plasma intensity as time proceeds, a control circuit (See FIG. 2(B)) of the control unit 119 is operated to automatically adjust the stab tuner 109 so as to maintain the plasma intensity always constant. Accordingly, the effective power of the microwave in the discharge space 106 is maintained always constant irrespective of the discharge time.

Figure 2B:
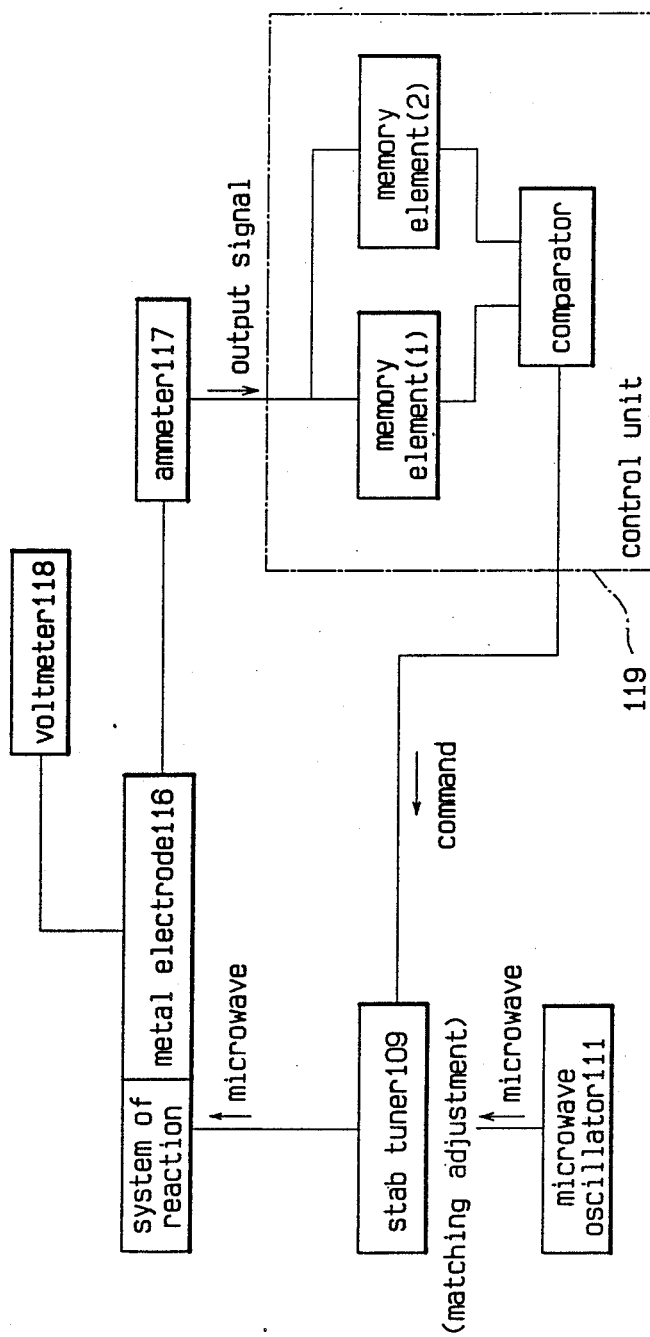
FIG. 2(B) is a block diagram of a control circuit in the apparatus shown in FIG. 2(A)

Referring to FIG. 2(B) which shows a circuit diagram of the apparatus shown in FIG. 2(A), current flowing in the metal electrode 116 at the time of starting of the discharge is led to an ammeter 117, and an output signal from the ammeter 117 is stored by a memory element (1) in the control unit 119. Then, a subsequent output signal from the ammeter 117 after a fixed time elapsed is periodically stored by another memory element (2) in the control unit 119. The value stored in the memory element (2) is compared with the value stored in the memory element (1) by a comparator. When the former is different from the latter, a command indicative of such a difference is generated from the control unit 119 to the stab tuner 109, so that the stab tuner 109 is automatically adjusted to make the matching adjusted, thereby maintaining the current flowing in the metal electrode 116 always constant.

Figure 3A:
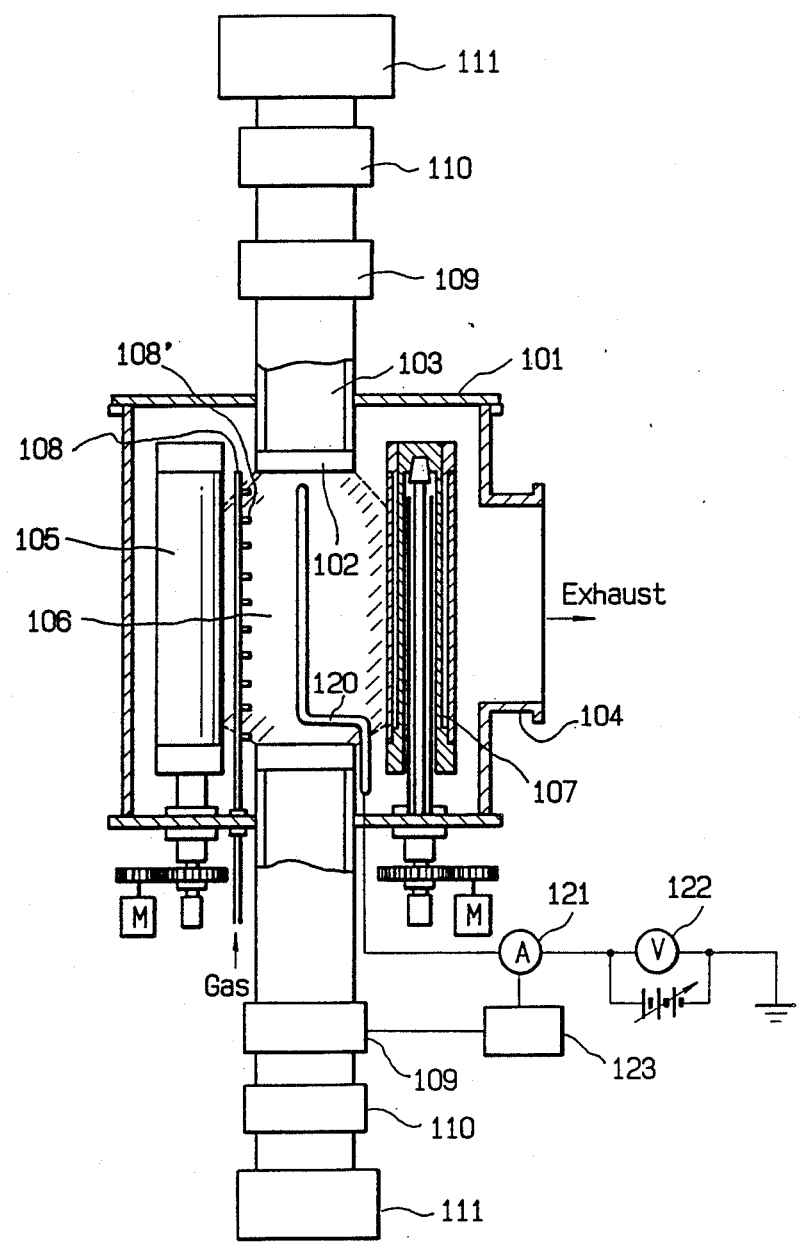
FIG. 3(A) is a schematic vertical sectional view of a further preferred embodiment of the fabrication apparatus suitable for producing an electrophotographic photosensitive member by the MW-PCVD method of the present invention.

Referring to FIG. 3(A) which shows a third preferred embodiment of the apparatus, a metal rod 120 made of nickel is inserted into the discharge space 106. Upon generation of the discharge, a variable voltage is applied to the metal rod 120. Then, current flowing in the metal rod 120 is led to an ammeter 121, and an output signal from the ammeter 121 is led to a control unit 123.

Figure 3B:
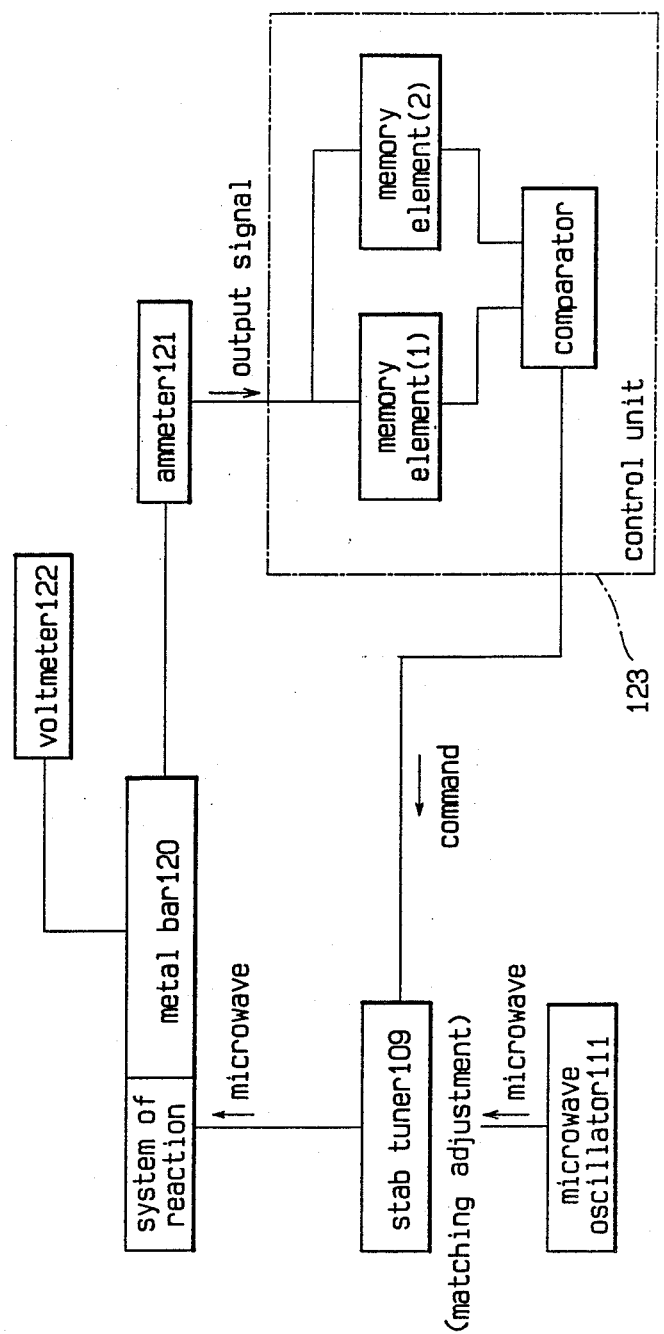
FIG. 3(B) is a block diagram of a control circuit in the apparatus shown in FIG. 3(A)

If the plasma intensity in the discharge space 106 is changed, and the current flowing in the metal rod 120 is changed as the discharge time proceeds, a control circuit (See FIG. 3(B)) in the control unit 123 is operated to automatically adjust the stab tuner 109 so as to maintain the amperage constant, that is, maintain the plasma intensity constant. Accordingly, the effective power of the microwave in the discharge space 106 is maintained always constant irrespective of the discharge time.

Referring to FIG. 3(B) which shows a circuit diagram of the device shown in FIG. 3(A), current flowing in the metal rod 120 at the time of starting of the discharge is led to the ammeter 121, and an output signal from the ammeter 121 is stored by a memory element (1) in the control unit 123. Then, a subsequent output signal from the ammeter 121 after a fixed time elapsed is periodically stored by another memory element (2) in the control unit 123. The value stored in the memory element (2) is compared with the value stored in the memory element (1) by a comparator. When the former is different from the latter, a command indicative of such a difference is generated from the control unit 123 to the stab tuner 109, so that the stab tuner 109 is automatically adjusted to make the matching adjusted, thereby maintaining the current flowing in the metal rod 120 always constant.

Figure 4A:
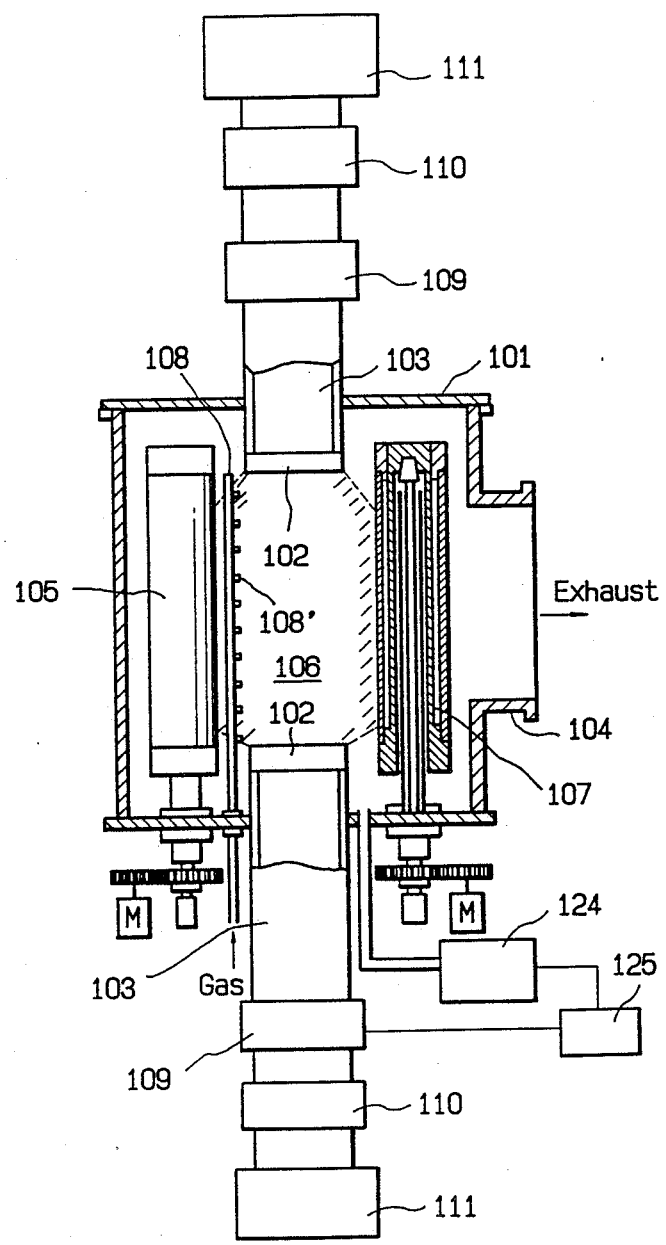
FIG. 4(A) is a schematic vertical sectional view of a still further preferred embodiment of the fabrication apparatus suitable for producing an electrophotographic photosensitive member by the MW-PCVD method of the present invention.

Referring to FIG. 4(A) which shows a fourth preferred embodiment of the appartus, a capacitance manometer 124 is provided in the reaction chamber 101, so as to detect the pressure in the discharge space 106, and a pressure signal is led to a control unit 125 to thereby automatically control the stab tuner 109.

The glow discharge decomposition of the reaction gas SiH4 for the film formation is accompanied by the formation reaction of hydrogen molecule as given by the following formula.

$$SiH_4 + e^- \rightarrow SiH^* + H + H_2 \quad (1)$$

The formation of $H_2$ in the formula (1) causes a reduction in the pressure in the discharge space 106 after the discharge as compared with the pressure before the discharge. When the discharge is generated ununiformly or the effective power in the reactor 101 is reduced as the discharge time proceeds, a quantity of $SiH_4$ undecomposed in the formula (1) is increased to cause a decrease in the quantity of $H_2$ to be generated. As a result, the inner pressure in the discharge space 106 is increased to change a plasma intensity. Then, a signal indicative of the increased inner pressure is generated from the parametron 124 to the control unit 125, and a control circuit (See FIG. 4(B)) in the control unit 125 is operated to automatically control the stab tuner 109, thus making the matching adjusted so that a resonance condition between the reaction chamber 101 and the microwave to be introduced through the microwave transmissive window 102 into the reaction chamber 101 may be matched as desired. Accordingly, the inner pressure in the discharge space 106 is maintained constant, and the plasma intensity is stabilized.

Figure 4B:
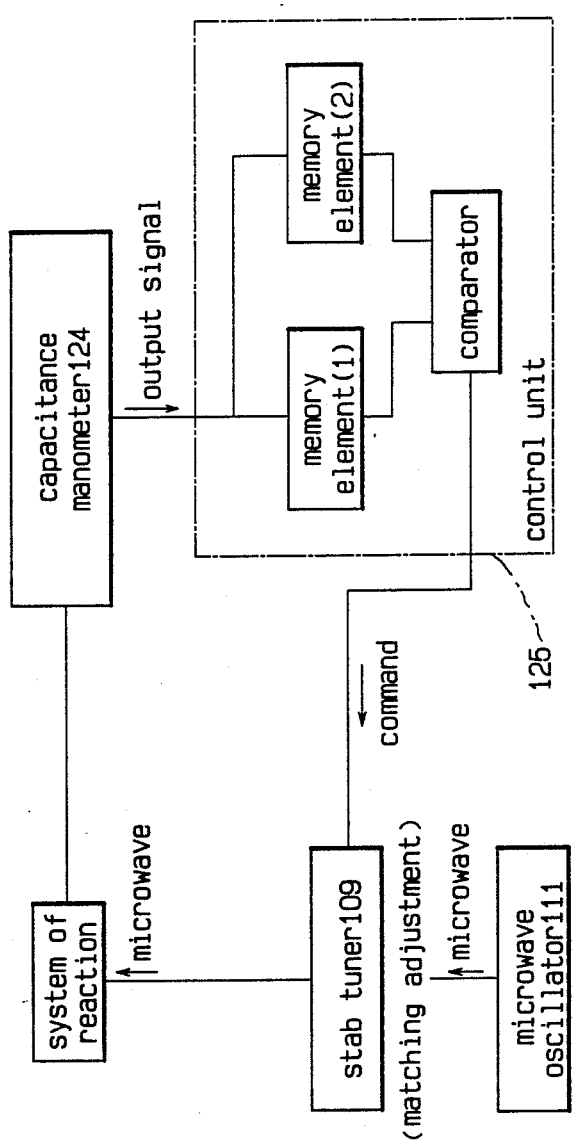
FIG. 4(B) is a block diagram of a control circuit in the apparatus shown in FIG. 4(A)

Referring to FIG. 4(B) which shows a circuit diagram of the apparatus shown in FIG. 4(A), the pressure in the discharge space 106 at the time of starting of the discharge is first detected by the capacitance manometer 124, and an output signal from the manometer 124 is stored by a memory element (1) in the control unit 125. Then, a subsequent output signal from the manometer 124 after a fixed time elapsed is periodically stored by another memory element (2) in the control unit 125. Then, the value stored in the memory element (2) is compared with the value stored in the memory element (1) by a comparator. When the former is different from the latter, a command indicative of such a difference is generated from the control unit 125 to the stab tuner 109, so that the stab tuner 109 is automatically adjusted to make the matching adjusted, to thereby maintain the inner pressure in the reaction system constant.

In this way, the plasma intensity in the discharge space 106 is controlled to be maintained always constant even after a long discharge time elapsed, to thereby maintain the effective power of the microwave to be introduced into the reaction chamber 101 constant. Accordingly, the film to be deposited onto the substrate 105 is made uniform in both the thickness and the quality, and a deposition rate of the film is maintained constant irrespective of the discharge time. Thus, it becomes possible to repeatedly and stably obtain a desired deposited film which is satisfactorily usable in an electrophotographic photosensitive member at a deposition rate.

In the deposited film forming process by way of the microwave plasma CVD method according to the present invention, the inner pressure of the reaction chamber upon depositing a film onto a substrate is preferably from 1 Torr to $1 \times 10^{-5}$ Torr, and more preferably from 1 Torr to $1 \times 10^{-4}$ Torr.

The present invention will be described more specifically while referring to the following examples, but the invention is no way limited only to these examples.

EXAMPLE 1

Using the fabrication apparatus shown in FIGS. 1(A) and 1(B), a light receiving layer was formed on an Al cylinder substrate 105 to prepare an electrophotographic photosensitive drum.

First, the inside of the reaction chamber 101 was evacuated through the exhaust pipe 104, and the substrate 105 was heated to a predetermined temperature by actuating the heater 107 and it was maintained at this temperature.

Then, under the film forming conditions shown in Table 1 silane gas ($SiH_4$), hydrogen gas ($H_2$), and diborane gas ($B_2H_6$) were fed through the gas liberation nozzles 108' of the gas supply pipe 108 into the reaction chamber 101 while maintaining a vacuum of the reaction chamber to a degree less than $1 \times 10^{-2}$ Torr. And, substrate 105 was rotated by a driving motor (not shown) at a speed of 10 r.p.m., and a microwave of 2.45 GHz was introduced from the microwave power source 111 through the waveguide 103 and the microwave transmissive window 102 into the discharge space 106. The matching between the microwave as introduced and the reaction chamber 101 was automatically adjusted by the stab tuner 109 to create a plasma in the discharge space 106. At that time, the optical emission intensity of excited species in the discharge space 106 was monitored by the detector 113 through the monitor window 112, and was indicated by the intensity indicator 114, and an output signal from the indicator was led to the control unit 115.

As the discharge space 106 has a microwave cavity resonator structure surrounded by the microwave transmissive window 102 and the cylindrical conductive substrate 105, the microwave energy as introduced was efficiently absorbed within the discharge space 106.

Thus, the raw material gases as introduced into the discharge space 106 were sufficiently excited by the microwave energy, and were decomposed to generate neutral radicals, ions, electrons, etc. These were reacted with each other to form a charge injection inhibition layer, a photoconductive layer and a surface layer in this order onto the surface of the conductive substrate 105.

The film forming conditions shown in Table 1 including the kinds and the flow rates of the raw material gases to be used, the inner pressure in the reaction chamber 101, the power of the microwave energy to be applied may be arbitrarily modified according to the layer constitution of a light receiving layer to be formed.

When the optical emission intensity of excited species in the discharge space 106 during the formation of the aforementioned layers was fluctuated from that a the time of starting of the discharge, an output signal was generated from the controller 115 to automatically adjust the stab tuner 109 and make the matching adjusted so that the optical emission intensity was equalized to that at the time of starting of the discharge. Table 2 shows the optical emission intensities at the time of starting the discharge and at the time of ending the discharge.

For the electrophotographic photosensitive member obtained above, a deposition rate of the light receiving layer was measured. And there were examined electrophotographic characteristics (charge retentivity, sensitivity and residual potential). Further, there was conducted image making. As a result, there were obtained results as shown in Table 3.

As Table 3 illustes, the resultant electrophotographic photosensitive member is satisfactory with respect to every evaluation item.

EXAMPLE 2

The procedures of Example 1 were repeated, except that the film forming conditions for the photoconductive layer were changed as shown in Table 4 to thereby obtain an electrophotographic photosensitive member. The resultant member was evaluated in the same way as in Example 1.

As a result, there were satisfactory results as shown in Table 5.

EXAMPLE 3

Using the apparatus shown in FIGS. 2(A) and 2(B), an electrophotographic photosensitive member was prepared under the conditions shown in Table 1 in the same manner as Example 1. When the discharge was generated, the voltage of +60 V was applied to the small metal electrode 116 inserted into the discharge space 106. At that time, the current flowing in the electrode 116 was supplied to the ammeter 117, and an output signal from the ammeter 117 was led to the control unit 119. When the plasma intensity changed as the discharge proceeded, and the current flowing in the electrode 116 was therefore changed from that at the time of starting the discharge, the control circuit in the control unit 119 was operated to automatically adjust the stab tuner 109 and thereby make the matching adjusted so that the amperage became equal to that at the time of starting the discharge.

Table 6 shows the amperages indicated by the ammeter 117 at the time of starting the discharge and at the time of ending the discharge in the formation of each constituent layer.

The resultant electrophotographic photosensitive member was evaluated in the same way as in Example 1.

As a result, there were obtained satisfactory results as shown in Table 7.

EXAMPLE 4

Using the apparatus shown in FIGS. 3(A) and 3(B), an electrophotographic photosensitive member was prepared under the conditions shown in Table 1 in the same manner as Example 1. When the discharge is generated, the D.C. voltage of +100 V was applied to the nickel rod 120 inserted into the discharge space 106. At this time, the current flowing in the rod 120 was supplied to the ammeter 121, and an output signal from the ammeter 121 was fed to the control unit 123. When the plasma intensity changed as the discharge proceeded, and the current flowing in the rod 120 was therefore changed from that at starting of the discharge, the control circuit in the control unit 123 was operated to automatically adjust the stab tuner 109 to thereby make the matching adjusted so that the amperage became equal to that at the time of starting the discharge.

Table 8 shows the amperages indicated by the ammeter 121 at the time of starting the discharge and at the time of ending the discharge in the formation of each constituent layer.

The resultant electrophotographic photosensitive member was evaluated in the same way as in Example 1.

As a result, there were obtained satisfactory results as shown in Table 9.

EXAMPLE 5

Using the apparatus shown in FIGS. 4(A) and 4(B), an electrophotographic photosensitive member was prepared under the conditions shown in Table 1 in the same manner as Example 1. When the discharge was generated, the pressure in the reaction chamber 101 was detected by the capacitance manometer 124. At that time, an output signal from the manometer 124 was led to the control unit 125. When the plasma intensity changed as the discharge proceeded, and the pressure in the reaction chamber 101 was therefore changed from that at the time of starting the discharge, the control circuit in the control unit 125 was operated to automatically adjust the stab tuner 109 to thereby make the matching adjusted so that the amperage became equal to that at the time of starting the discharge.

Table 10 shows the inner pressure in the reactor 101 at the time of starting the discharge and at the time of ending the discharge in the formation of each constituent layer.

The resultant electrophotographic photosensitive member was evaluated in the same way as in Example 1.

As a result, there were obtained satisfactory results as shown in Table 11.

COMPARATIVE EXAMPLE

Figure 7A:
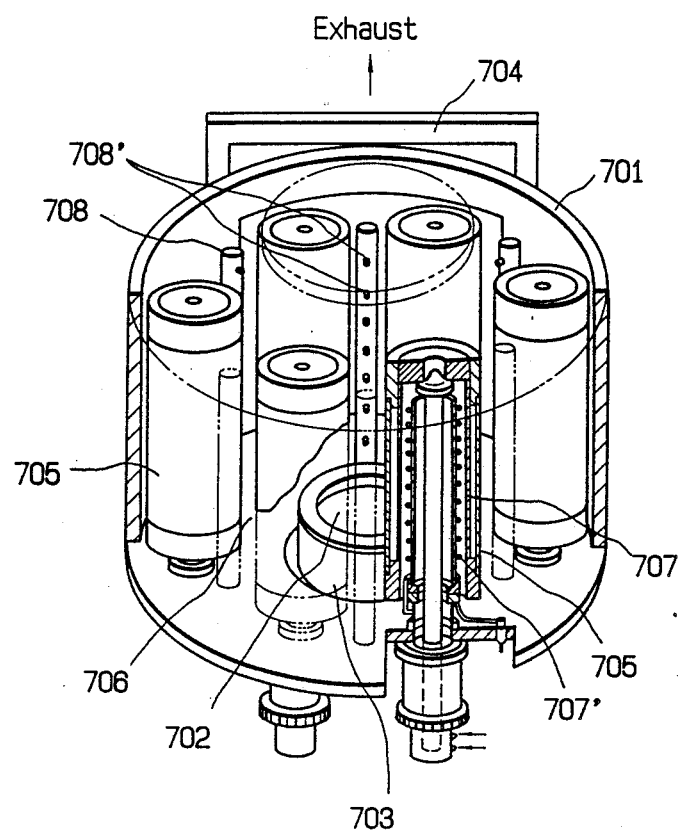
FIG. 7(A) is a schematic perspective view of the conventional deposited film forming apparatus by a microwave plasma CVD method.
Figure 7B:
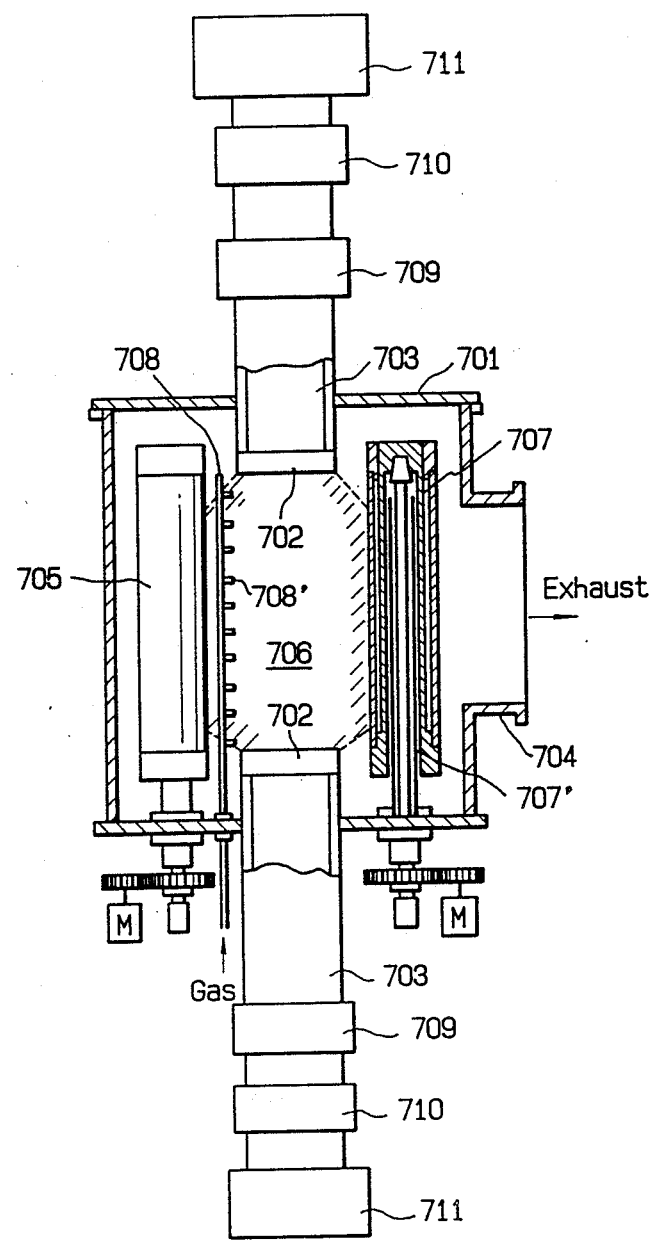
FIG. 7(B) is a vertical sectional view of the apparatus shown in FIG. 7(A)
Figure 7C:
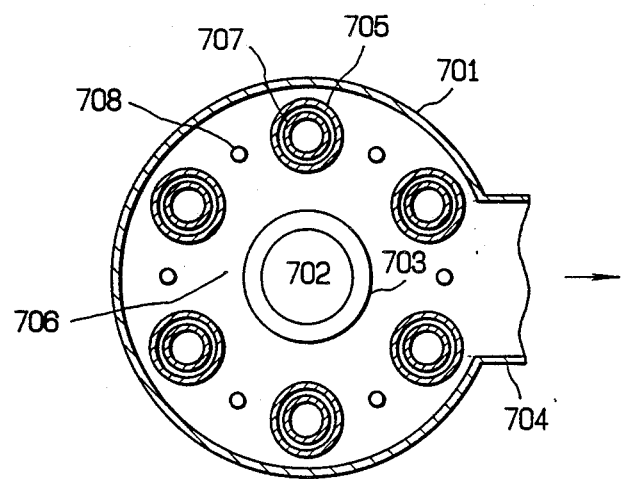
FIG. 7(C) is a horizontal sectional view of the apparatus shown in FIG. 7(A).

Using the apparatus shown in FIGS. 7(A) to 7(C), an electrophotographic photosensitive member was prepared under the conditions shown in Table 1 in the same manner as Example 1. In this case, the matching adjustment of the microwave oscillated from the microwave power source 111 was manually conducted by the stab tuner 109, and the discharge was conducted respectively in the formation of each constituent layer.

Table 12 shows the differences between the incident power and the reflected power of the wattmeter 110 at the time of starting the discharge and at the time of ending the discharge.

The electrophotographic photosensitive member was evaluated in the same way as in Example 1.

As a result, there were obtained unsatisfactory results as shown in Table 13.

TABLE 1

| Layer forming conditions | Constituent Layer | | |
|---|---|---|---|
| | Charge injection inhibition layer | Photo-conductive layer | Surface layer |
| Flow rate | | | |
| SiH$_4$:sccm | 500 | 800 | 200 |
| H$_2$:sccm | 500 | 500 | 0 |
| B$_2$H$_6$:ppm (against SiH$_4$) | 2000 | 0 | 0 |
| NO:sccm | 20 | 0 | 0 |
| CH$_4$:sccm | 0 | 0 | 1000 |
| Inner pressure (mTorr) | 1.5 | 2 | 3 |
| Microwave power (w) | 700 | 1500 | 1000 |
| Deposition period (min) | 10 | 40 | 5 |

TABLE 2

| | Charge injection inhibition layer | Photoconductive layer | Surface layer |
|---|---|---|---|
| Optical emission intensity of excited species at the time when discharge started ($\mu$w/cm$^2$) | $0.32 \times 10^{-1}$ | 0.125 | $0.15 \times 10^{-1}$ |
| Optical emission intensity of excited species at the time when discharge terminated ($\mu$w/cm$^2$) | $0.30 \times 10^{-1}$ | 0.120 | $0.13 \times 10^{-1}$ |

TABLE 3

| Charge retentivity | Sensitivity | Residual potential | Resultant image | Deposition rate of the photo-conductive layer (Å/sec.) |
|---|---|---|---|---|
| ⊚ | ⊚ | ⊚ | ⊚ | 100 |

⊚: Excellent
○: Good
X: Not applicable

TABLE 4

| Forming conditions for photoconductive layer | Drum No. | | | | |
|---|---|---|---|---|---|
| | 2-1 | 2-2 | 2-3 | 2-4 | 2-5 |
| Gases used & their flow rates | | | | | |
| SiH$_4$:sccm | 700 | 600 | 800 | 600 | 1000 |
| H$_2$:sccm | 300 | 400 | 600 | 0 | 300 |
| SiF$_4$:sccm | 30 | 60 | 50 | 0 | 40 |
| B$_2$H$_6$:ppm (against SiH$_4$) | 3 | 5 | 3 | 0 | 10 |
| Inner pressure (mTorr) | 1 | 0.7 | 0.8 | 0.6 | 1.5 |
| Microwave power (W) | 1700 | 1600 | 1800 | 2000 | 2500 |
| Deposition period (min) | 44 | 50 | 36 | 42 | 30 |

TABLE 5

| Drum No. | Charge retentivity | Sensitivity | Residual potential | Resultant image | Deposition rate of the photo-conductive layer (Å/sec.) |
|---|---|---|---|---|---|
| 2-1 | ⊚ | ⊚ | ⊚ | ⊚ | 90 |
| 2-2 | ⊚ | ⊚ | ○ | ⊚ | 80 |
| 2-3 | ⊚ | ⊚ | ⊚ | ⊚ | 110 |
| 2-4 | ⊚ | ○ | ⊚ | ⊚ | 95 |
| 2-5 | ○ | ⊚ | ⊚ | ⊚ | 130 |

⊚: Excellent
○: Good
X: Not applicable

TABLE 6

| | Charge injection inhibition layer | Photoconductive layer | Surface layer |
|---|---|---|---|
| Reading on ammeter at the time when discharge started (A) | 2.1 | 5.0 | 1.5 |
| Reading on ammeter at the time when discharge terminated (A) | 2.0 | 4.9 | 1.5 |

TABLE 7

| Charge retentivity | Sensitivity | Residual potential | Residual image | Deposition rate of the photoconductive layer (Å/sec.) |
|---|---|---|---|---|
| ○ | ◎ | ○ | ○ | 95 |

◎: Excellent
○: Good
X: Not applicable

TABLE 8

| | Charge injection inhibition layer | Photoconductive layer | Surface layer |
|---|---|---|---|
| Reading on ammeter at the time when discharge started (A) | 1.2 | 10 | 0.7 |
| Reading on ammeter at the time when discharge terminated (A) | 1.2 | 10 | 0.7 |

TABLE 9

| Charge retentivity | Sensitivity | Residual potential | Resultant image | Deposition rate of the photoconductive layer (Å/sec.) |
|---|---|---|---|---|
| ○ | ◎ | ◎ | ○ | 98 |

◎: Excellent
○: Good
X: Not applicable

TABLE 10

| | Charge injection inhibition layer | Photoconductive layer | Surface layer |
|---|---|---|---|
| Inner pressure at the time when discharge started (mTorr) | 1.5 | 2 | 3 |
| Inner pressure at the time when discharge terminated (mTorr) | 1.5 | 2 | 3 |

TABLE 11

| Charge retentivity | Sensitivity | Residual potential | Resultant image | Deposition rate of the photoconductive layer (Å/sec.) |
|---|---|---|---|---|
| ◎ | ◎ | ◎ | ◎ | 100 |

◎: Excellent
○: Good
X: Not applicable

TABLE 12

| | Charge injection inhibition layer | Photoconductive layer | Surface layer |
|---|---|---|---|
| Difference between the incident power and the reflected power at the time when discharge started (W) | 700 | 1500 | 1000 |
| Difference between the incident power and the reflected power at the time when discharge terminated (W) | 690 | 1520 | 990 |

TABLE 13

| Charge retentivity | Sensitivity | Residual potential | Resultant image | Deposition rate of the photoconductive layer (Å/sec.) |
| --- | --- | --- | --- | --- |
| X | X | X | X | 20 |

◉: Excellent
○: Good
X: Not applicable

What is claimed is:

1. In a microwave plasma chemical vapor deposition process for the formation of a functional deposited film on a plurality of cylindrical substrates by means of a microwave plasma chemical vapor deposition conducted in a substantially enclosed cylindrical film-forming chamber, said film-forming chamber comprising a circumferential wall having an end portion thereof hermetically provided with a microwave introducing window to which a waveguide extending from a microwave power source is connected, said film-forming chamber having a discharge space and a plurality of rotatable cylindrical substrate holders therein, each of said substrate holders being capable of having one of said cylindrical substrates positioned thereon, said substrate holders being concentrically arranged in said film-forming chamber so as to circumscribe said discharge space, said film-forming chamber being provided with means for supplying a film forming raw material gas into said discharge space and means for evacuating said film-forming chamber, wherein said process includes forming a functional deposited film on each of said cylindrical substrates by generating a plasma by microwave glow discharge in said film-forming raw material gas to form said functional deposited film while simultaneously rotating said cylindrical substrates, the improvement which comprises the steps of: (a) monitoring an effective power of microwaves to be introduced into said film-forming chamber, (b) generating an output signal indicative of the effective power of said microwaves corresponding to a given plasma intensity, and (c) controlling a match between (i) said effective power of said microwaves corresponding to a given plasma intensity in film-forming chamber and (ii) said microwaves to be introduced into said film-forming chamber in accordance with said output signal to thereby maintain the plasma intensity constant in said film-forming chamber irrespective of the time elapsed, whereby a functional deposited film exhibiting enhanced uniformity in thickness and in quality is formed on each of said cylindrical substrates at a high deposition rate.

2. The process according to claim 1, wherein said generating step is based upon optical emission intensity of excited species upon discharging in said film-forming chamber.

3. The process according to claim 1, wherein said generating step is conducted employing a Langmuir probe to measure plasma intensity.

4. The process according to claim 1, wherein said generating step is conducted based on optical current flowing in a metal rod inserted into said film-forming chamber upon application of a D.C. voltage to said metal rod.

5. The process according to claim 1, wherein said generating step is conducted according to a pressure in said film-forming chamber.

6. The process according to claim 1, including supplying a film-forming raw material gas via a gas supply pipe made of a dielectric material capable of efficiently transmitting a microwave which is provided with a plurality of gas liberation nozzles capable of liberating a film-forming raw material gas toward said discharge space.

7. The process according to claim 1, including forming an amorphous silicon, functional deposited film on each of said cylindrical substrates.

8. The process according to claim 7, including forming an amorphous silicon, functional deposited film as a light receiving layer of an electrophotographic photosensitive cylindrical chamber.

* * * * *